United States Patent
Kawamoto

[11] Patent Number: 5,831,338
[45] Date of Patent: Nov. 3, 1998

[54] POWER MOSFET AND METHOD OF PREPARING THE SAME

[75] Inventor: Atsunobu Kawamoto, Tokyo, Japan

[73] Assignee: Mitsubishi Denki Kabushiki Kaisha, Tokyo, Japan

[21] Appl. No.: 681,554

[22] Filed: Jul. 23, 1996

[30] Foreign Application Priority Data

Jan. 29, 1996 [JP] Japan ................................. 8-012740

[51] Int. Cl.$^6$ ........................... H01L 23/48; H01L 23/52
[52] U.S. Cl. ..................... 257/784; 257/288; 257/328
[58] Field of Search ........................... 257/288, 784, 257/328

[56] References Cited

U.S. PATENT DOCUMENTS

| | | | |
|---|---|---|---|
| 4,067,039 | 1/1978 | Gaicki | 257/784 |
| 4,907,734 | 3/1990 | Conrus et al. | 257/784 |
| 5,212,396 | 5/1993 | Nakagawa et al. | 257/784 |
| 5,298,793 | 3/1994 | Kotani et al. | 257/784 |
| 5,455,442 | 10/1995 | Neilson et al. | 257/784 |
| 5,489,793 | 2/1996 | Matsusako et al. | 257/784 |
| 5,539,244 | 7/1996 | Mori et al. | 257/784 |

*Primary Examiner*—David Ostrowski
*Attorney, Agent, or Firm*—Burns, Doane, Swecker & Mathis, LLP

[57] ABSTRACT

The power MOSFET includes a substrate of the power MOS type FET having a source electrode, a part of which corresponds to a source pad area formed directly thereon. The device also includes a bonding wire for connecting the source electrode to the outside. The bonding wire is melt-bonded on the source pad area by an ultra-sonic vibration having a frequency of about 50 to about 70 kHz.

8 Claims, 6 Drawing Sheets

POWER MOSFET AND METHOD OF PREPARING THE SAME

BACKGROUND OF THE INVENTION

1. Field of Invention

The invention relates to a power MOS type FET, especially to a vertical power MOSFET used in automobiles, and to a method of preparing the same.

2. Description of the Prior Art

Conventional vertical Power MOSFETs have a typical construction as shown in FIGS. 6, 7 and 8. In FIG. 7, which shows an enlarged vertical sectional view along line A-A' of FIG. 6, a substrate 1 is provided with n$^+$-layer 4, n$^-$-layer 5, p-diffused well regions 6, 12 and n$^+$-regions 7 formed, respectively, from a bottom to a top surface of the substrate. On the substrate 1, gate electrodes 8 are mounted through an insulating layer 13 to a position across the p region 6 between a pair of n$^+$-regions 7, 7. Source electrodes 9, covered by a glass coat 11, are positioned over the top surface except the insulated areas 13 to connect the p regions 6, 12 and n+ regions 7. On the other hand, a drain electrode 10 is positioned at a bottom of the substrate 1, so that a channel between the source region 9 and the drain region 10 is designed to be formed in a vertical direction to be controlled by the gate 8.

In the power MOSFET, in order to connect the gate electrode 8 and the source electrode 9 to the outside, each of the electrodes can be withdrawn through a gate pad 2 and a source pad 3 formed on the substrate as shown in FIG. 6. The source pad 3 is clearly shown in FIG. 8 wherein a bonding wire 14 made of Al—Si is melt-bonded on the source pad 3 under which a gate electrode 13 is positioned.

Further, in order to obtain a desired contact area and contact resistance at the bonding part 14a of FIG. 8, the conventional wire-bonding process has been typically carried out by an ultra-sonic vibration having a frequency of 110 kHz. In case of conventional wire-bonding, device disruption caused by an insufficient contact strength between the wire and the source pad sometimes happens.

Accordingly, a first object of the present invention is to provide a method of preparing a power MOSFET having substantially zero percent defects and a sufficient bonding strength between the wire and the source pad.

A second object of the present invention is to provide an improved power MOSFET having substantially zero percent defects and a sufficient bonding strength between the wire and the source pad.

As a result of the present inventors' search, it has been found that MOSFETs generally comprise many gate electrodes positioned lengthwise and breadthwise on the substrate 1, so that, as a bonding wire having a diameter of 300 $\mu$m typically requires a source pad area having a size of 650×1100 $\mu$m, there necessarily exists at least one gate electrode under the source pad area 3 as shown in FIG. 8. Therefore, it has been found that this construction causes an increasing percentage of defects.

On the other hand, from the relation between the bonding vibration frequency and the bonding strength, shown in FIG. 5 (a), showing a distribution of the bonding strength obtained by means of bonding at 60 kHz and FIG. 5B, showing a distribution of the bonding strength obtained at 110 kHz, it can be seen that the bonding strength can be distributed in a smaller region as the frequency increases. Thus, it has been found that the bonding strength at 60 kHz is more effective than 110 kHz with respect to the bonding strength in spite of there being no difference with respect to the contact area and contact resistance at the bonding area 14a.

SUMMARY OF INVENTION

According to a first aspect of the present invention, there is provided a method of preparing a power MOSFET which comprises:

1) a step of providing a substrate of the power MOSFET having a source electrode which part corresponding to a source pad area is directly formed thereon; and 2) a step of melt-bonding a wire for connecting the source electrode to the outside on the source pad area by an ultra-sonic vibration having a frequency of about 50 to about 70 kHz.

It has been found that the most effective frequency is about 60 kHz. However, as long as the frequency is selected within the range of about 50 to about 70 kHz, substantially the same effects can be obtained with respect to the bonding strength.

In a preferred embodiment, the method according to the present invention is applicable to a vertical power MOSFET wherein the source pad area is positioned on a p-type well region formed at a surface of the substrate and having no gate electrode.

In a preferred embodiment, a bonding wire may be used which has a diameter of 100 to 300 $\mu$m, especially 300 $\mu$m more or less, that is, 270 to 330 $\mu$m in order to obtain an excellent bonding strength. Many kinds of conventional bonding wires can be used. Among them, an aluminum wire is preferred because an excellent bonding strength can he obtained.

According to a second aspect of the present invention, there is provided a power MOSFET which comprises: 1) a substrate having a source electrode which corresponds to a source pad area formed directly thereon; and 2) a bonding wire for connecting the source electrode to the outside which is melt-bonded on the source pad area by an ultra-sonic vibration having a frequency of from about 50 to about 70 kHz.

DETAILED DESCRIPTION OF THE PREFERRED EMBODIMENTS

Figure 1:
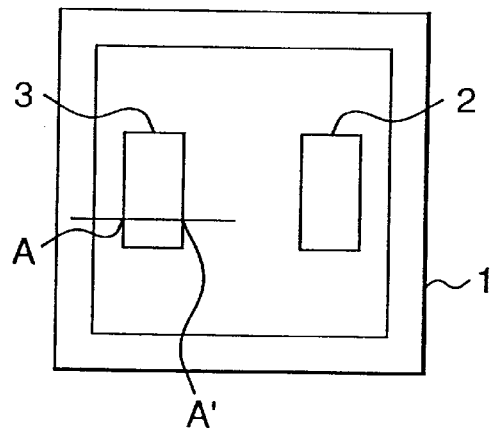
FIG. 1 is a plan view showing an embodiment of a power MOSFET which can be used in an automobile.

FIG. 1 illustrates a substrate 1 of a vertical power MOSFET on which a gate pad 2 and a source pad 3 are present.

Figure 2:
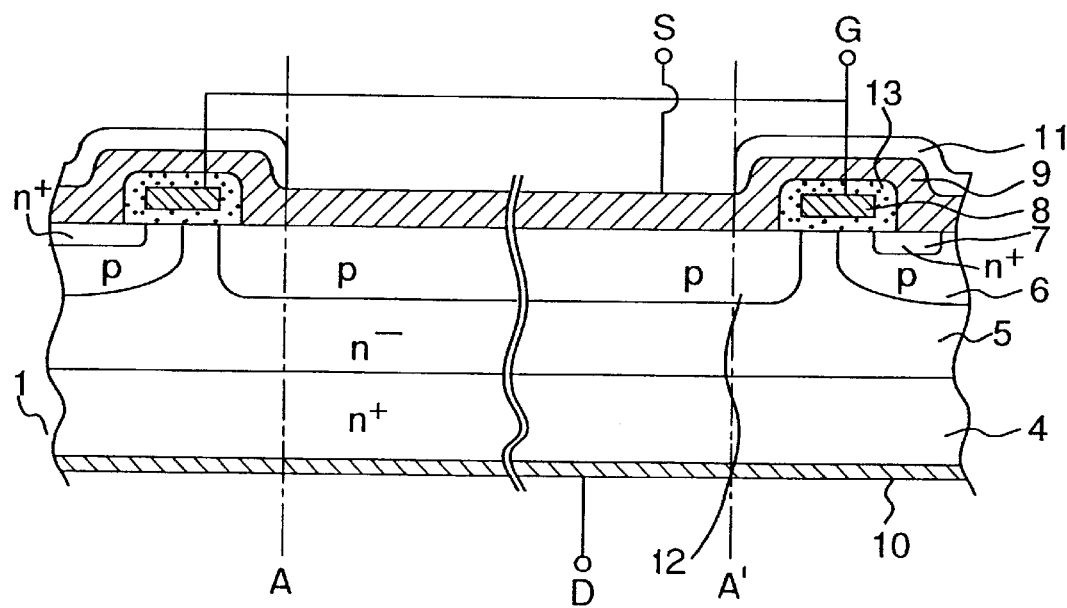
FIG. 2 is an enlarged cross-sectional view along line A-A' of FIG. 1.

FIG. 2 is a cross-sectional view along line A-A' of FIG. 1, wherein the substrate 1 is provided with n$^+$-layer 4 and n$^-$-layer 5. On the n$^-$-layer 5, p-well regions 6 and 12 are formed by impurity diffusion to make all of the source pad areas into p-well regions. n$^+$-regions 7 are formed in the p-diffused well regions 6.

On the substrate 1, gate electrodes 8 covered by an insulating layer 13 are positioned across the p-well regions 6 between n$^+$-regions 7, 7 while source electrodes 9 covered by a glass coat 11 are positioned over the top surface except for the insulated areas 13 to connect the p-regions 6, 12 and the n$^+$-regions 7. On the other hand, a drain electrode 10 is positioned on the bottom of the substrate 1.

Figure 3:
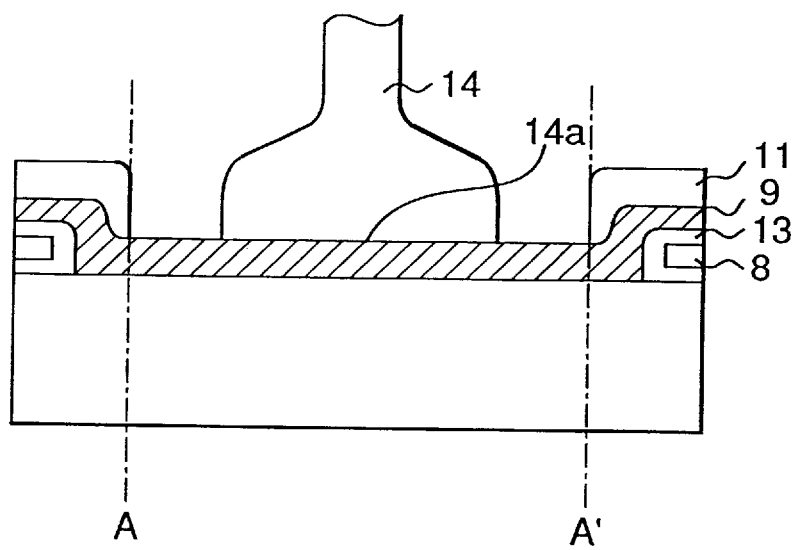
FIG. 3 is a cross-sectional view showing a bonding condition between the wire and the source pad of FIG. 2.

In the power MOSFET, in order to connect the gate electrode 8 and the source electrode 9 to the outside, each of those electrodes can be withdrawn through a gate pad 2 and a source pad 3, respectively, as shown in FIG. 1. The source pad 3 is clearly shown in FIG. 3 wherein a bonding wire 14 made of Al—Si is melt-bonded on the source pad 3 under which no gate electrode is positioned.

The vertical power MOSFET can be prepared according to the present invention as shown in FIGS. 4A to 4H in which line A-A' in each step corresponds to line A-A' of the source pad shown in FIG. 1. The source pad has a breadth of 650 μm and a length of 1100 μm.

Figure 4A:
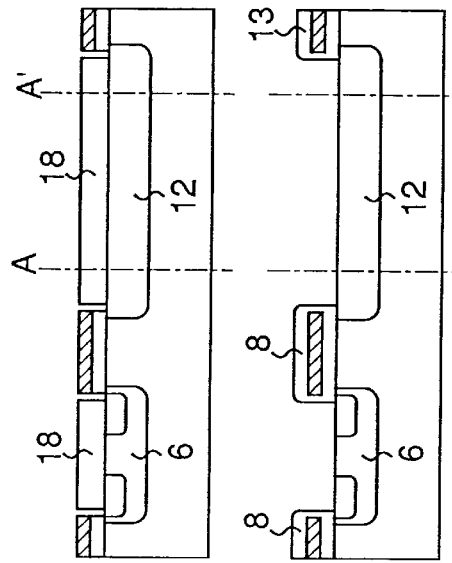
FIGS. 4A to 4H show a step diagram of preparing the power MOSFET of FIG. 1A.

In the step shown in FIG. 4A, the n$^+$-layer 4 (not shown) and the n$^-$-layer 5 are formed. Then, in the n$^-$-layer 5 there is formed by use of a boron (B) heat diffusion through a first resist-mask 15, p-well region 6 on which a channel of MOSFET is formed together with the p-well region 12, which has an area more than twice as large as the area of the p-well region 6. As a result, no gate electrode 8 is formed. That is, a part of a source electrode 9 corresponding to an area of a source pad 2 will be directly formed on the p-well region.

Figure 4E:
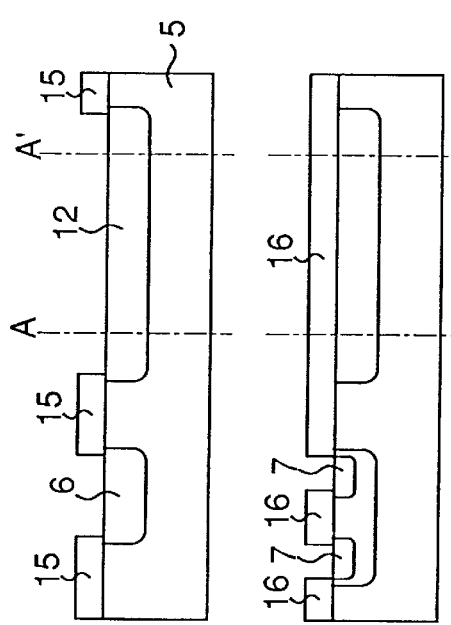
Figure 4B:
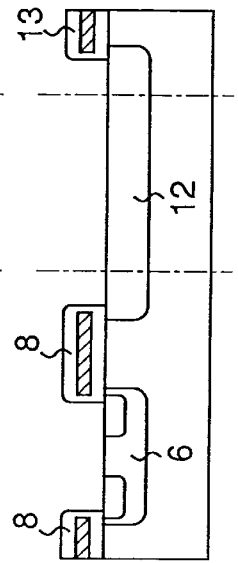

In the step shown in FIG. 4B, after removing the first resist-mask 15, a second resist-mask 16 is formed on the substrate 1 to cover all of the p-well region 12 and a portion of the p-well region 6. The substrate is then subjected to a phosphorus (P) heat diffusion, so that the p-well regions 12 have no n$^+$ regions 7 found therein while the p-well regions 6 have n$^+$ regions 7 formed therein. The n$^+$-regions 7 will be the source regions of the power MOSFET.

Figure 4F:
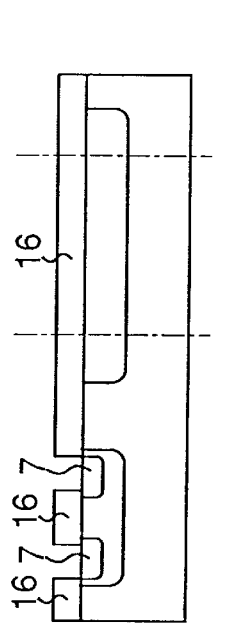
Figure 4C:
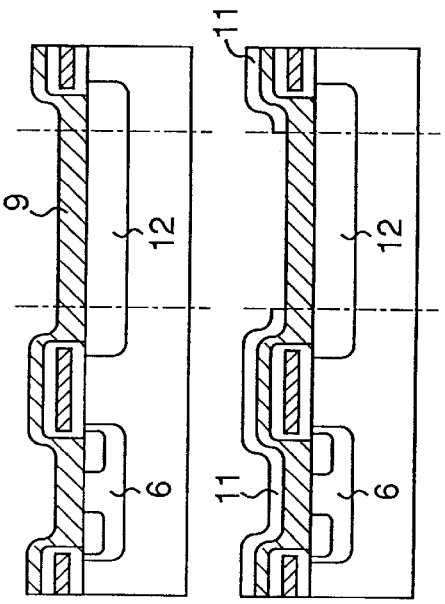

In the step shown in FIG. 4C, after removing the second resist-mask 16, a third resist-mask 17 is formed. Then, SiO$_2$ insulating layers 13 and silicon gate electrodes 8 are made between the p-well regions 6, 6 and 6, 12 in positions not covered by the third resist-mask 17 as shown in FIG. 4D.

In the step shown in FIG. 4E, after removing the third resist-mask 17, a fourth resist-mask 18 is formed. Through the fourth resist-mask 18 a SiO$_2$ insulating layer 13 is deposited on the gate electrodes 8.

In the step shown in FIG. 4F, after removing the fourth resist-mask 18, the gate electrodes 8 covered by the insulating layers 13 can be completed and distributed uniformly on the substrate.

Figure 4G:
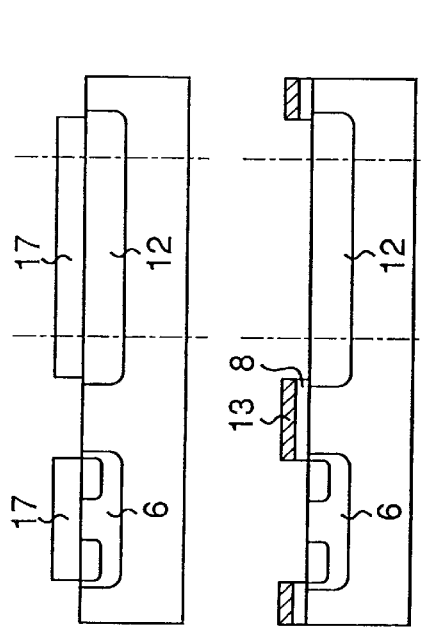
Figure 4D:
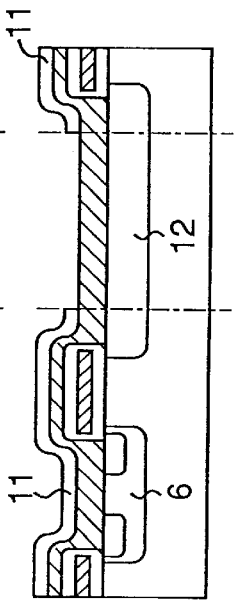

In a step shown in FIG. 4G, an aluminum layer is deposited across the entire surface of the substrate to make a source electrode 9. A part of the source electrode corresponding to an area of the source pad 3 is formed directly on the p-well region 12.

Figure 4H:
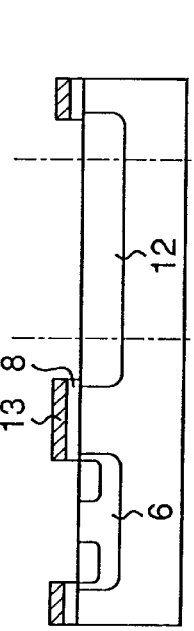

In the step shown in FIG. 4H, a glass coat 11 is formed over the surface of the substrate except for the area of the source pad 3.

Finally, the drain electrode 10 is formed at the bottom of the substrate to complete the power MOSFET as shown in FIG. 2.

In order to connect the source pad 3 to the outside, the wire-bonding of aluminum wire 14 having a diameter of about 300 μm is applied to the source pad 3.

The following Table shows comparative percent defect data (defects causing a short-circuit between the gate electrode and the source electrode) according to the present invention (at 60 kHz) and conventional methods (at 60 kHz and 110 kHz).

TABLE

|  |  | percent defects |
|---|---|---|
| The present invention | (60 kHz) | 0% |
| The conventional method | (60 kHz) | 10 and several % |
|  | (110 kHz) | several % |

Figure 5A:
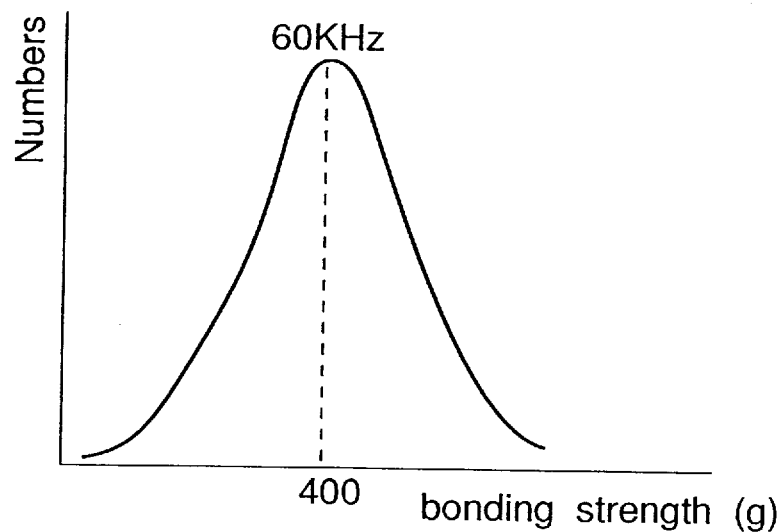
FIG. 5A is a graph showing the bonding strength distribution at an ultra-sonic vibration of 60 kHz and FIG. 5B is a graph showing the bonding strength distribution at 110 kHz.
Figure 5B:
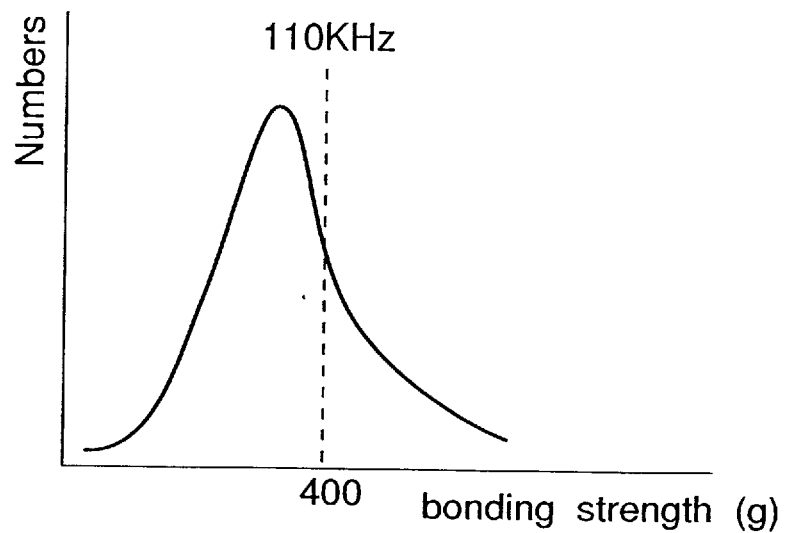
Figure 6:
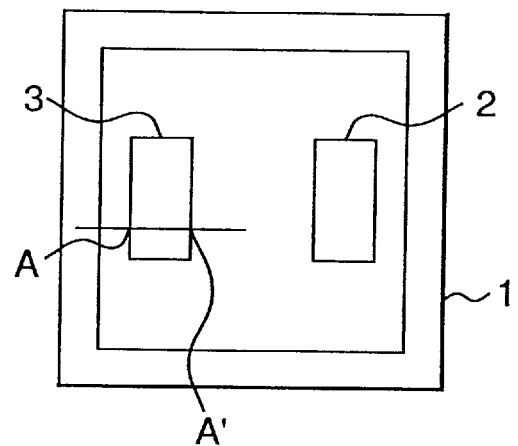
FIG. 6 is a plan view showing a conventional power MOSFET which can be used in an automobile.
Figure 7:
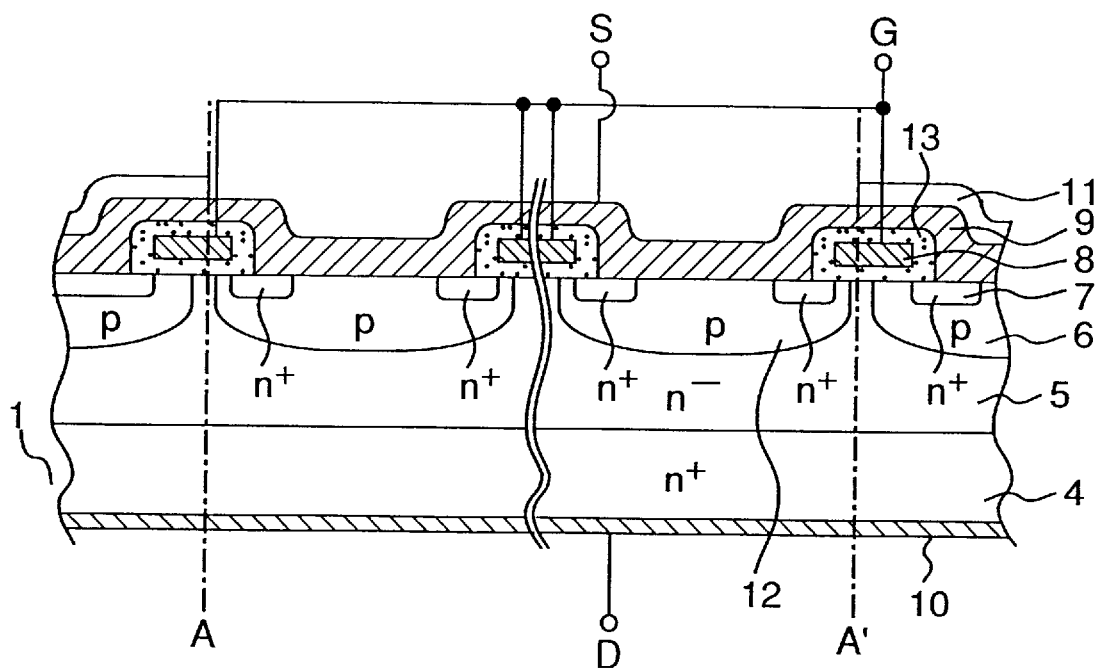
FIG. 7 is an enlarged sectional view along line A-A' of FIG. 6.
Figure 8:
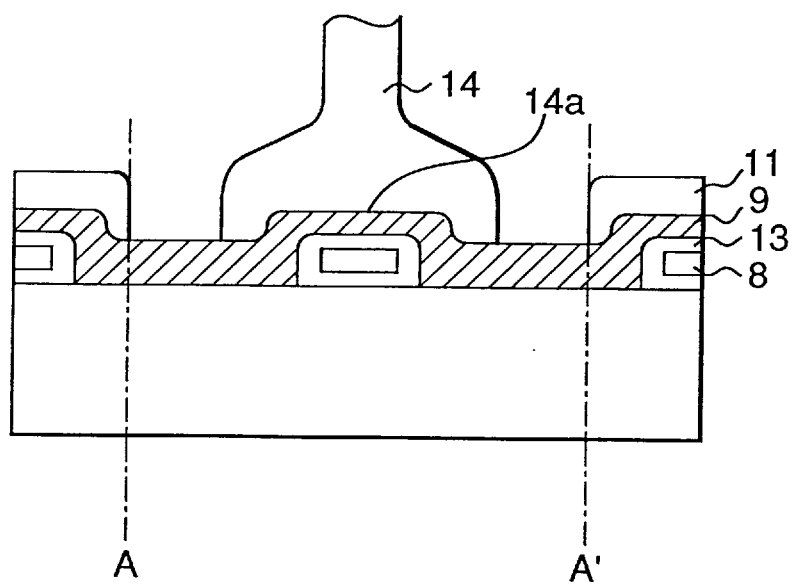
FIG. 8 is a cross-sectional view showing a bonding condition between the wire and the source pad of FIG. 7.

As seen from the above data, substantially zero percent defects can be obtained through the present invention because 60 kHz bonding provides a stronger contact between the wire 14 and the source pad 14a in comparison to 110 kHz bonding (see FIGS. 5A and 5B). In addition, no gate electrode is formed under the source pad according to the invention, which electrode would be destroyed at 60 kHz bonding.

Further, while the power MOSFET has no gate electrode under the source pad, no loss of the device characteristics is caused thereby.

What is claimed is:

1. A power MOSFET which comprises:
   1) a substrate comprising a source electrode, the source electrode including at least one source pad area which is disposed over no gate electrode; and
   2) a bonding wire for connecting said source electrode to the outside, wherein said bonding wire is melt-bonded on said source pad area by an ultra-sonic vibration having a frequency of about 50 to about 70 kHz.

2. The power MOSFET according to claim 1, wherein the substrate further comprises an n$^+$-type layer, an n$^-$-type layer over the n$^+$-type layer, p-type regions formed in the n$^-$-type layer, n$^+$-type regions formed in the p-type regions;

gate electrodes formed across an npn junction made up of the n$^+$-type region, the p-type regions and the n$^-$-type layer, the gate electrodes being distributed breadthwise and lengthwise on an upper surface of the substrate and being covered by an insulating layer;

the source electrode covering the upper surface of the substrate including the gate electrodes;

the source pad area being directly on the p-type region between gate electrodes;

and a drain electrode mounted on a bottom surface of the substrate.

3. The power MOSFET according to claim 1, further comprising a plurality of gate electrodes.

4. The power MOSFET according to claim 1, further comprising a plurality of gate electrodes, wherein the bonding wire is disposed over no gate electrode.

5. The power MOSFET according to claim 1, further comprising a plurality of gate electrodes, wherein the melt-bonding of the bonding wire is effective to provide substantially zero percent defects caused by short-circuiting between the gate electrode and the source electrode.

6. The power MOSFET according to claim 1, wherein the MOSFET is a vertical power MOSFET.

7. A power MOSFET which comprises:
   1) a substrate comprising a source electrode and a plurality of gate electrodes, the source electrode including at least one source pad area which is disposed over no gate electrode; and 2) a bonding wire for connecting said source electrode to the outside, wherein said bonding wire is melt-bonded on said source pad area, and the melt-bonding of said bonding wire is effective to provide substantially zero percent defects caused by short-circuiting between the gate electrode and the source electrode.

8. The power MOSFET according to claim 7, wherein the MOSFET is a vertical power MOSFET.

* * * * *